United States Patent

Heijna

[11] Patent Number: 5,838,198
[45] Date of Patent: Nov. 17, 1998

[54] GAIN CONTROL FOR PARALLEL-ARRANGED DIFFERENTIAL PAIRS

[75] Inventor: Roeland J. Heijna, Nijmegen, Netherlands

[73] Assignee: U.S. Philips Corporation, New York, N.Y.

[21] Appl. No.: 854,047

[22] Filed: May 9, 1997

[30] Foreign Application Priority Data

May 15, 1996 [EP] European Pat. Off. .............. 96201332

[51] Int. Cl.$^6$ .................................................... H03G 3/30
[52] U.S. Cl. ......................... 330/254; 330/307; 455/251.1
[58] Field of Search .................................. 330/254, 279, 330/307; 455/241.1, 251.1, 253.2

[56] References Cited

U.S. PATENT DOCUMENTS

| | | | |
|---|---|---|---|
| 4,864,248 | 9/1989 | Jansen | 330/254 |
| 5,355,534 | 10/1994 | Kimura | 455/323 |
| 5,742,203 | 4/1998 | Van De Plassche et al. | 330/254 |

Primary Examiner—James B. Mullins
Attorney, Agent, or Firm—Steven R. Biren

[57] ABSTRACT

In a gain control circuit (GCC), a plurality of parallel-arranged differential pairs (DP1,DP2 . . . DPN) is unbalanced as a function of a gain control signal (Vagc). Furthermore, the gain of individual differential pairs (DP1, DP2 . . . DPN) is reduced when the unbalance is increased, and vice versa. Accordingly, a favorable performance in terms of noise and distortion can be obtained.

4 Claims, 3 Drawing Sheets

GAIN CONTROL FOR PARALLEL-ARRANGED DIFFERENTIAL PAIRS

BACKGROUND OF THE INVENTION

1. Field of the Invention

The invention relates to a gain control circuit and method in which parallel-arranged differential pairs are unbalanced as a function of a gain control signal. The invention also relates to receivers which incorporate such a gain control circuit.

2. Description of the Related Art

International Application PCT/IB95/00848, corresponding to U.S. patent application Ser. No. 08/543,731, filed Oct. 16, 1995 (attorney docket PHN 15,068), now U.S. Pat. No. 5,742,203, describes a prior-art gain control circuit of the above type. In the prior-art gain control circuit, a number (N) of parallel arranged differential pairs constitutes a transadmittance stage. This means that an input voltage is commonly applied between the bases of the differential pairs, and an output current is taken from mutually coupled collectors of these differential pairs. The gain of this transadmittance stage is varied by unbalancing the differential pairs to a larger or smaller extent. For a maximum gain, all of the differential pairs are balanced in such a way that their transfer characteristics overlap. In that case, the gain of the transadmittance stage is equal to the gain of each individual differential pair multiplied by the number (N) of differential pairs. For a minimum gain, the differential pairs are unbalanced in such a way that the transfer characteristics do not substantially overlap. In that case, the gain of the transadmittance stage is approximately equal to the gain of an individual differential pair. For a certain gain between maximum and minimum, the differential pairs are unbalanced in such a way that their transfer characteristics overlap to a certain extent.

The prior-art gain control circuit can be used to bring the amplitude of an input signal to a desired level. The gain is relatively high when the input signal amplitude is relatively low, and vice versa. The linear range of the prior-art gain control circuit changes with the gain in a desired fashion. When the gain is relatively high, the linear range seen at the input is smallest. This is in accordance with the relatively low input signal amplitude. Conversely, when the gain is relatively low, the linear range seen at the input is relatively wide, such that it is accommodated to the relatively high amplitude input signal. Thus, the linear range of the prior-art gain control circuit changes in accordance with the input signal amplitude. This helps to keep the distortion relatively low throughout the gain control range of the gain control circuit.

SUMMARY OF THE INVENTION

It is an object of the invention to provide a gain control which, with respect to the prior-art, is even more favorable in terms of both distortion and noise. To this end, a first aspect of the invention provides a gain control circuit comprising a plurality of parallel-arranged differential pairs which have mutually coupled control terminals for receiving an input signal, and mutually coupled main current terminals for furnishing an output signal, and means for unbalancing the differential pairs as a function of a gain control signal, characterized in that the unbalancing means are arranged to increase or decrease the gain of individual differential pairs when the unbalance of these pairs is decreased or increased, respectively, and characterized in that the gain control circuit forms part of a semiconductor body and that the mutually coupled control terminals of the plurality of differential pairs form part of a base region having two connections for supplying a current thereto for unbalancing the differential pairs as a function of the gain control signal from which the current is derived by the unbalancing means. A second aspect of the invention provides a gain control method employing a plurality of parallel-arranged differential pairs which have mutually coupled control terminals for receiving an input signal and mutually coupled main current terminals for furnishing an output signal, the method comprising the step of unbalancing the differential pairs as a function of a gain control signal, characterized by the step of increasing or decreasing the gain of individual differential pairs when the unbalance of these pairs is decreased or increased, respectively. A third aspect of the invention provides a receiver having an amplification circuit for amplifying a reception signal, the amplification circuit comprising a gain control circuit as defined above.

The invention takes the following aspects into consideration. There is an optimal state of unbalance for each particular input signal amplitude, in terms of noise and distortion. If the unbalance is too large, the input signal will not sufficiently drive each differential pair and, consequently, the noise will be unnecessarily high. However, if the unbalance is too small, the input signal will no longer fit in the linear range seen at the input and, consequently, the distortion will be unnecessarily high.

In many applications, the gain control circuit is part of a gain control loop which seeks to bring the output signal amplitude to a desired level. Consequently, the input signal amplitude is inversely proportional to the gain. Thus, the noise and distortion behavior of the gain control circuit depend on the relation between the gain and the state of unbalance of the differential pairs.

In accordance with the invention, the gain of individual differential pairs is reduced when the unbalance is increased, and vice versa. Thus, the gain is reduced or increased not only by a respective increase or reduction of the unbalance of the differential pairs, but also by a respective reduction or increase of the gain of the differential pairs individually. Accordingly, compared to the prior-art, the unbalance varies to a smaller extent with the gain. Furthermore, the extent of variation can be adjusted, whereas in the prior art the relation between linear range width and gain is fully fixed. Compared with the prior art the aforementioned two aspects allow a significantly better approximation of the optimal linear range throughout the gain control range, and thus, a significantly better performance in terms of noise and distortion.

In addition to a favorable noise and distortion behavior, some further advantages of the invention are as follows. One further advantage is that the relation between gain and gain control signal is more or less logarithmic. Another further advantage is that the gain control range is relatively large.

The invention also provides a receiver in which a reception signal is amplified by means of the above-identified gain control circuit. The favorable noise and distortion behavior of the gain control circuit promotes a good reception quality.

The invention and additional features, which may be optionally used to implement the invention to advantage, are apparent from and will be elucidated with reference to the examples described hereinafter.

BRIEF DESCRIPTION OF THE DRAWINGS

In the drawings.

Like elements have like reference signs throughout the drawings.

DESCRIPTION OF THE PREFERRED EMBODIMENTS

Figure 1:
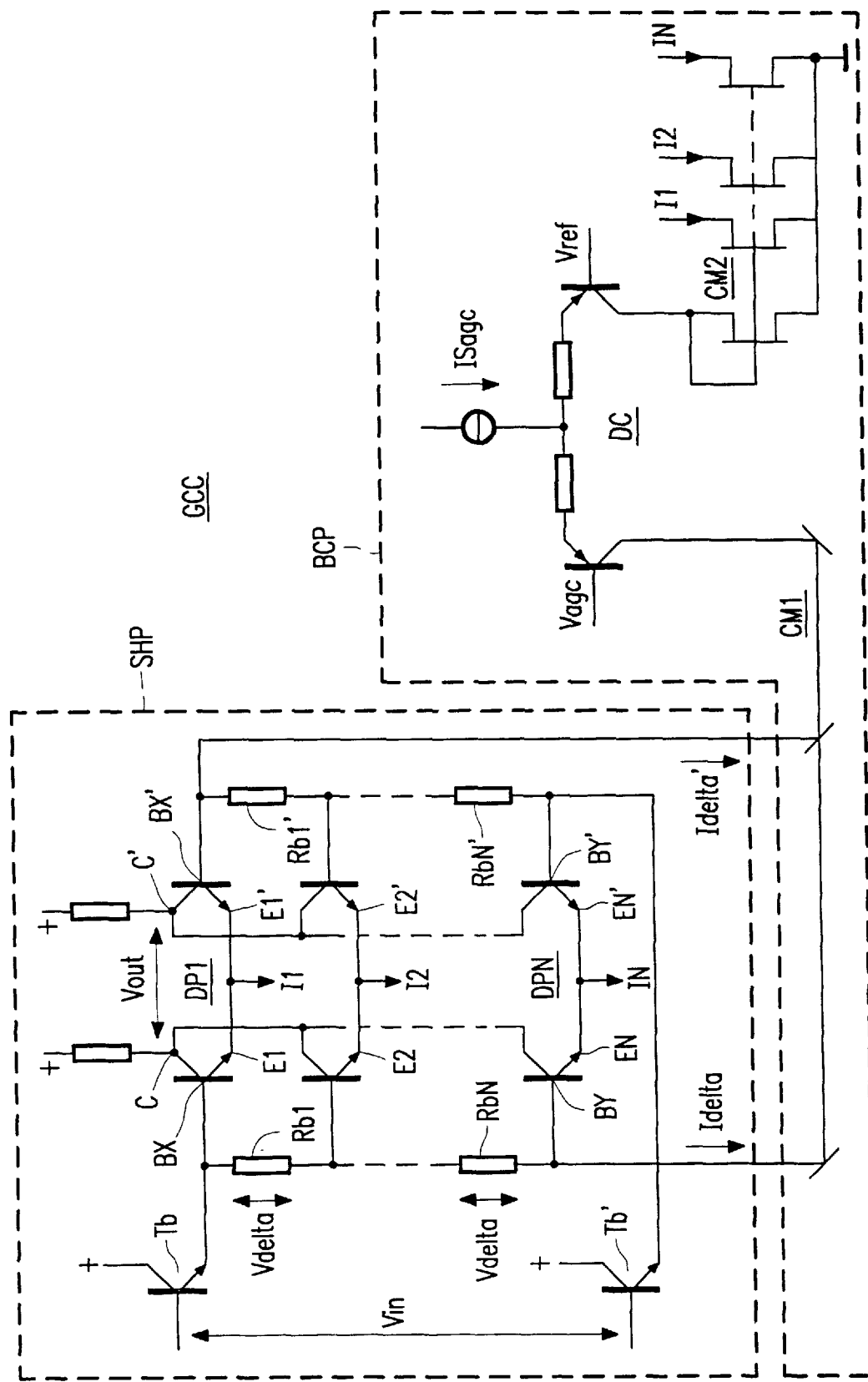
FIG. 1 shows, in a circuit diagram form, an example of a gain control circuit in accordance with the invention.

FIG. 1 shows an example of a gain control circuit GCC in accordance with the invention. The FIG. 1 gain control circuit amplifies a differential input signal Vin to produce a differential output signal Vout. The amount of amplification is controlled by a gain control voltage Vagc.

The FIG. 1 gain control circuit can be functionally divided into two parts: a signal-handling part SHP and a bias control part BCP. The core of the signal-handling part SHP is formed by a number N of differential pairs DP1,DP2 . . . DPN which are arranged in parallel. The differential pairs DP1,DP2 . . . DPN receive the differential input signal Vin between their bases via buffer transistors Tb and Tb'. The output signal Vout is taken from the collectors of the differential pair DP1,DP2 . . . DPN. Two DC biasing parameters are adjusted to set the gain at a certain level: an offset voltage Vdelta between two consecutive differential pairs and tail currents I1,I2 . . . IN supplied to the common emitters of the differential pairs DP1,DP2 . . . DPN. The offset voltage Vdelta is the result of two offset currents Idelta and Idelta' which flow through two strings of base interconnection resistances Rb1 . . . RbN and Rb1' . . . RbN', respectively.

The bias control part BCP effectively translates the gain control voltage Vagc into the two offset currents Idelta and Idelta' and the tail currents I1,I2 . . . IN. In the bias control part BCP, a differential pair DC divides a current ISagc into two portions. The magnitudes of these portions depend on the value of the gain control voltage Vagc with respect to a reference voltage Vref. A first current mirror CM1 derives the offset currents Idelta and Idelta' from one portion, and a second current mirror CM2 derives the tail currents I1,I2 . . . IN from the other portion.

If the gain control voltage Vagc is substantially higher than the reference voltage Vref, almost the entire current ISagc will be used for the tail currents I1,I2 . . . IN, whereas the offset currents Idelta and Idelta' and, consequently, the offset voltage Vdelta will be practically nil. In that case, each individual differential pair DP1,DP2 . . . DPN in the signal-handling part will have a maximal gain and the transfer characteristics of the differential pairs DP1,DP2 . . . DPN will substantially overlap. Accordingly this setting, the signal-handling part SHP has a maximal gain.

If, starting from the above condition, the gain control voltage Vagc is reduced, the following effects will occur. Below a certain gain control voltage Vagc (H), the magnitude of the tail currents I1,I2 . . . IN will start to be less than ISagc, and the offset currents Idelta and Idelta' will start to be different from zero. The gain control voltage Vagc(H) marks the high gain boundary of the gain control range.

If the gain control voltage is further reduced, the tail currents I1,I2 . . . IN will decrease, whereas the offset currents Idelta and Idelta' and, consequently, the offset voltage Vdelta, will increase. A decrease of the tail current reduces the gain of the individual differential pairs DP1,DP2 . . . DPN and, consequently, reduces the gain of the signal handling part SHP as a whole. An increase of the offset voltage Vdelta reduces overlap between transfer characteristics of the differential pairs DP1,DP2 . . . DPN. This has a twofold effect on the signal-handling part SHP: it widens the linear range width seen at the input and further reduces the gain in addition to gain reduction due to the decrease of the tail currents I1,I2 . . . IN.

Thus, in the FIG. 1 gain control circuit, the gain is reduced by increasing the unbalance between the differential pairs DP1,DP2 . . . DPN and by decreasing the gain of the individual differential pairs. The linear range width is affected by the unbalance between the differential pairs only. Accordingly, a relation between gain and linear range width can be obtained which is favorable in terms of noise and distortion.

Figure 2:
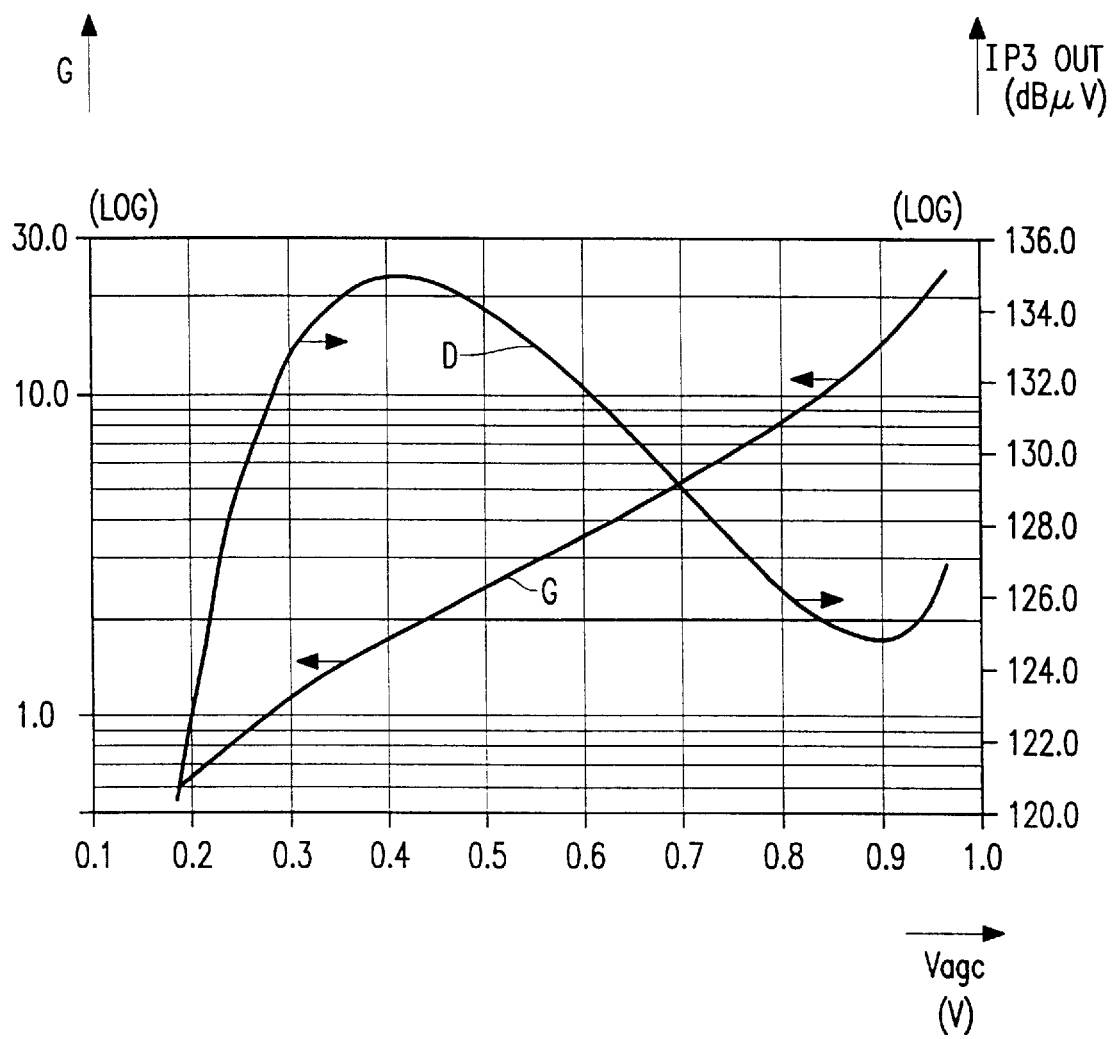
FIG. 2 shows, in a single graph, the gain control and distortion characteristic of an implementation of the FIG. 1 gain control circuit.

FIG. 2 shows gain control and distortion characteristics of the FIG. 1 gain control circuit. The gain control voltage Vagc is plotted on the horizontal axis. The gain—or amplification factor—G is plotted on the left-hand vertical axis which has a logarithmic scale. The gain-versus-control voltage characteristic is shown as curve G. The third-order intercept point at the output (IP3out) is plotted on the right-hand vertical axis in decibel-microvolt (dBuV). The distortion-versus-control voltage characteristic is shown as curve D. Arrows indicate to which vertical axis, left or right, a curve refers.

FIG. 2 shows that the gain-versus-control voltage characteristic is essentially logarithmic, which is advantageous in many applications. For example, if the gain-versus-control voltage is more or less logarithmic, it will be possible to achieve a gain control of a substantially constant bandwidth with relatively simple circuitry. FIG. 2 further shows that the third-order distortion is relatively low throughout the gain control range and only varies to a little extent.

Figure 3:
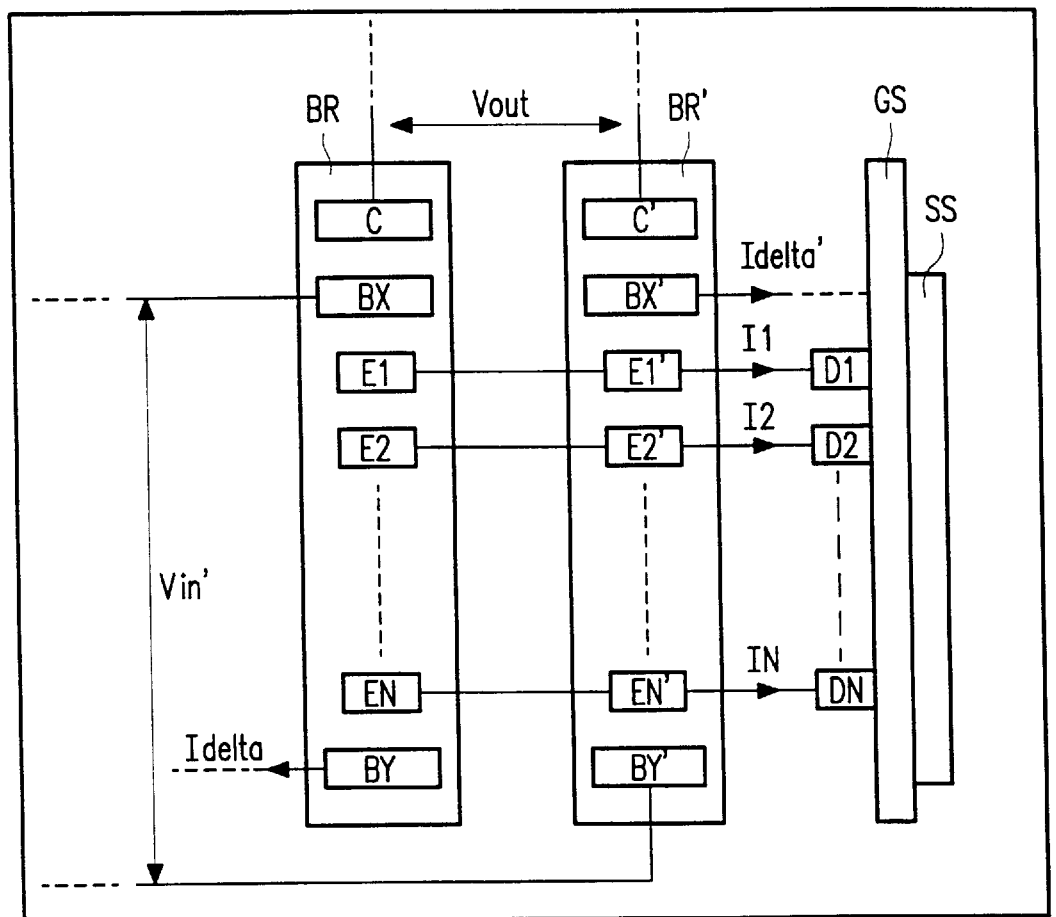
FIG. 3 shows, in the form of a lay-out sketch, an example of an integrated circuit implementation of the FIG. 1 gain control circuit.

FIG. 3 shows an example of an integrated circuit implementation of the FIG. 1 gain control circuit. In a semiconductor body, two relatively large base regions BR and BR', respectively, are formed. Each base region BR and BR' comprises the following elements: collector contacts C and C', first base contacts BX and BX', second base contacts BY and BY', and a number of N emitter contacts E1,E2 . . . EN and E1',E2' . . . EN', respectively. The emitter, base and collector connections in the FIG. 1 circuit diagram, which correspond to the aforementioned contacts in the FIG. 3 lay-out sketch, have been denoted by the same reference signs. Furthermore, signals which are supplied to these connections in the FIG. 1 circuit diagram are also indicated in FIG. 3.

If one compares the FIG. 1 circuit diagram with the FIG. 3 lay-out sketch, the following may be noted. One transistor of each differential pair DP1,DP2 . . . DPN in FIG. 1, is implemented in the base region BR, shown in FIG. 3, by means of emitter contacts E1 . . . EN, respectively, whereas the other transistor is implemented in the base region BR' by means of emitter contacts E1' . . . E2', respectively. Furthermore, the base interconnection resistances Rb1 . . . RbN and Rb1' . . . RbN', shown in FIG. 1, are formed by the semiconductor material in the base regions BR and BR', respectively. In the FIG. 3 implementation, the offset current Idelta flows from the base contact BX to the base contact region BY, and the offset current Idelta' flows from the base contact BY' to the base contact BX'. The offset currents Idelta and Idelta' flowing through the semiconductor base material in the base regions BR and BR', respectively, cause a voltage gradient between the base contacts of each base region. Accordingly, an offset voltage is obtained between locations in the semiconductor base material near two consecutive emitter contacts, which offset voltage corresponds to the offset voltage Vdelta indicated in FIG. 1.

FIG. 3 further shows some implementation details of the current mirror CM2 in the FIG. 1 circuit diagram. In the FIG. 3 implementation, the current mirror CM2 is formed by a gate strip GS, a source strip SS and a plurality of drain regions D1 . . . DN which provide tail currents I1,I2 . . . IN, respectively. The electrical equivalent of this implementation of current mirror CM2 is an assembly of N MOS-transistors which have mutually coupled gate and source connections, as illustrated in FIG. 1.

Figure 4:
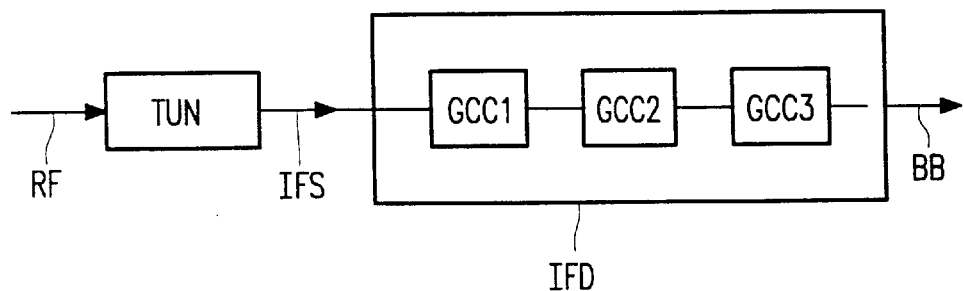
FIG. 4 shows, in a block diagram form, a receiver in accordance with the invention.

FIG. 4 shows an example of a receiver incorporating three gain control circuits GCC1, GCC2 and GCC3 of the type shown in FIG. 1. The FIG. 4 receiver comprises two main parts: a tuner TUN and an intermediate-frequency (IF) and demodulation part IFD. The tuner TUN selects and frequency-converts a desired reception signal RF to obtain an intermediate-frequency signal IFS. The intermediate-frequency and demodulation part IFD derives a baseband signal BB from the intermediate-frequency signal IFS. The intermediate frequency and demodulation part IFD may be formed, for example, by one or more integrated circuits in combination with suitably chosen external components.

In the intermediate-frequency and demodulation part IFD, the intermediate-frequency signal IFS is brought to a desired level for further processing. To this end, the gain control circuits GCC1, GCC2 and GCC3 are used. The gain control circuits GCC1, GCC2 and GCC3 are arranged in cascade to obtain a sufficiently large gain control range combined with a satisfactory noise and distortion. For example, if each gain control circuit GCC1, GCC2 and GCC3 has a gain control range of 20 dB, within which the noise and distortion are satisfactory, the cascade will have a gain control range of 60 dB.

For reasons of conciseness, the manner in which the gain control circuits GCC1, GCC2 and GCC3 are cascaded is not shown in FIG. 4. Those skilled in the art may readily conceive many suitable manners of cascading. For example, suitable buffer and DC level shift circuitry may be coupled between two consecutive gain control circuits. Furthermore, the reference voltage Vref for each gain control circuit GCC1, GCC2 and GCC3 may be chosen to be such that a smooth transition between the gain control ranges of the individual gain control circuits is obtained.

It should be noted that the above-mentioned examples illustrate rather than limit the invention, and that those skilled in the art will be able to design may alternative embodiments without departing from the scope of the appended claims.

I claim:

1. A gain control circuit comprising a plurality of parallel-arranged differential pairs which have mutually coupled control terminals for receiving an input signal, and mutually coupled main current terminals for furnishing an output signal, and means for unbalancing the differential pairs as a function of a gain control signal, characterized in that the unbalancing means comprises means for increasing or decreasing the gain of individual differential pairs when the unbalance of these pairs is decreased or increased, respectively.

2. A gain control circuit as claimed in claim 1, characterized in that the gain control circuit forms part of a semiconductor body and that the mutually coupled control terminals of the plurality of differential pairs form part of a base region having two connections for supplying a current thereto for unbalancing the differential pairs as a function of the gain control signal from which the current is derived by the unbalancing means.

3. A method for effecting gain control employing a plurality of parallel-arranged differential pairs which have mutually coupled control terminals for receiving an input signal and mutually coupled main current terminals for furnishing an output signal, the method comprising the step:
    unbalancing the differential pairs as a function of a gain control signal,
characterized in that said method further comprises the step:
    increasing or decreasing the gain of individual differential pairs when the unbalance of these pairs is decreased or increased, respectively.

4. A receiver having an amplification circuit for amplifying a reception signal, the amplification circuit comprising a gain control circuit comprising a plurality of parallel-arranged differential pairs which have mutually coupled control terminals for receiving an input signal, and mutually coupled main current terminals for furnishing an output signal, and means for unbalancing the differential pairs as a function of a gain control signal, characterized in that the unbalancing means comprises means for increasing or decreasing the gain of individual differential pairs when the unbalance of these pairs is decreased or increased, respectively.

* * * * *